(12) United States Patent
Kim et al.

(10) Patent No.: US 10,446,107 B2
(45) Date of Patent: Oct. 15, 2019

(54) DATA DRIVER AND DISPLAY APPARATUS INCLUDING THE SAME

(71) Applicant: DB HiTek Co., Ltd., Seoul (KR)

(72) Inventors: Bo Sung Kim, Suwon-si (KR); Hae Lyong Chung, Seongnam-si (KR); Sun Young Yoon, Seoul (KR); Yu Min Hong, Incheon (KR)

(73) Assignee: DB HiTek Co., Ltd., Seoul (KR)

( * ) Notice: Subject to any disclaimer, the term of this patent is extended or adjusted under 35 U.S.C. 154(b) by 106 days.

(21) Appl. No.: 15/833,848

(22) Filed: Dec. 6, 2017

(65) Prior Publication Data

US 2019/0051264 A1    Feb. 14, 2019

(30) Foreign Application Priority Data

Aug. 10, 2017  (KR) .................. 10-2017-0101741
Sep. 29, 2017  (KR) .................. 10-2017-0127485

(51) Int. Cl.
*G09G 3/36*     (2006.01)
*H03K 5/22*     (2006.01)

(52) U.S. Cl.
CPC ......... *G09G 3/3688* (2013.01); *G09G 3/3677* (2013.01); *G09G 2310/0286* (2013.01); *G09G 2310/0289* (2013.01); *G09G 2310/0291* (2013.01); *G09G 2310/08* (2013.01); *G09G 2320/043* (2013.01); *G09G 2330/023* (2013.01); *H03K 5/22* (2013.01)

(58) Field of Classification Search
CPC ... G09G 2310/0286; G09G 2310/0289; G09G 2310/0291; G09G 2310/08; G09G 2320/043; G09G 2330/023; G09G 3/3677; G09G 3/3688; H03K 5/22
See application file for complete search history.

(56) References Cited

U.S. PATENT DOCUMENTS

| | | | | |
|---|---|---|---|---|
| 6,333,730 B1* | 12/2001 | Lee | ....................... | G09G 3/3685 345/100 |
| 2004/0207434 A1* | 10/2004 | Miura | .................. | G09G 3/3688 327/4 |
| 2008/0042689 A1* | 2/2008 | Yen | ....................... | G09G 3/3688 326/82 |
| 2013/0286002 A1* | 10/2013 | Huang | ................. | G09G 3/3611 345/213 |
| 2013/0307838 A1* | 11/2013 | Kim | ....................... | G09G 5/001 345/212 |
| 2018/0374427 A1* | 12/2018 | Kuei | ........................ | G09G 3/34 |

* cited by examiner

*Primary Examiner* — Afroza Chowdhury
(74) *Attorney, Agent, or Firm* — Andrew D. Fortney; Central California IP Group, P.C.

(57) ABSTRACT

A data driver includes a latch unit configured to store sequential first data and second data, a comparator configured to receive the first data and the second data from the latch unit and to output a comparison signal by comparing the received first data with the received second data, a digital-analog converter configured to output an analog signal corresponding to the first data from the latch unit, an output unit configured to provide a drive current having a current value, the drive current configured to drive a display panel based on a bias signal and the analog signal, and a bias unit configured to adjust, set or maintain the bias signal based on the comparison signal. The current value is based on the bias signal.

13 Claims, 5 Drawing Sheets

DATA DRIVER AND DISPLAY APPARATUS INCLUDING THE SAME

This application claims the benefit of Korean Patent Application Nos. 10-2017-0101741, filed on Aug. 10, 2017, and 10-2017-0127485, filed on Sep. 29, 2017 which are hereby incorporated by reference as if fully set forth herein.

BACKGROUND OF THE INVENTION

Field of the Invention

Embodiments of the present invention relate to a data driver and a display apparatus including the same.

Discussion of the Related Art

A data driver may include a latch for driving source lines of a display panel and for temporarily storing data, a level shifter for shifting the voltage level of the stored data, a digital-analog converter for converting the digital voltage level-shifted data into an analog signal, and output buffers for amplifying the analog signal and outputting the amplified analog signal to the source lines.

When a voltage is applied to liquid crystal pixels in one direction (e.g., upon driving a liquid crystal panel), since deterioration of the liquid crystal is accelerated, an inversion process (e.g., periodic inversion) is performed to change the polarity of an image data voltage applied to liquid crystal.

The data driver may serve to apply a specific voltage to the pixels of the display panel to charge capacitors of the pixels.

SUMMARY OF THE INVENTION

Accordingly, embodiments of the present invention are directed to a data driver capable of reducing power consumption while preventing screen deterioration, and a display apparatus including the same.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof, as well as the appended drawings.

To achieve these objects and other advantages and in accordance with the purpose(s) of embodiments of the invention, as embodied and broadly described herein, a data driver includes a latch unit configured to store sequential first data and second data, a comparator configured to receive the first data and the second data from the latch unit and to output a comparison signal by comparing the received first data with the received second data, a digital-analog converter configured to output an analog signal corresponding to the first data from the latch unit, an output unit configured to provide a drive current having a current value, the drive current being configured to drive a display panel based on a bias signal and the analog signal, and a bias unit configured to adjust, set or maintain the bias signal based on the comparison signal. The current value of the drive current is based on the bias signal.

The comparator may output a comparison signal having (i) a first logical value if the first data is equal to the second data, (ii) a second logical value different from the first logical value if the first data is not equal to the second data.

The comparator may generate the comparison signal by performing one or more logic operations (e.g., an AND operation) on the first data and the second data.

The latch unit may include a first latch unit configured to store the first data and a second latch unit configured to receive the first data from the first latch unit. The second latch unit may store the first data when the first latch unit receives the second data.

The comparator may receive the first data from the second latch unit and the second data from the first latch unit.

The first data may include a number of bits that is equal to a number of bits of the second data.

The comparator may include (i) a first logical operation unit configured to output first logical values resulting from a first logic operation on each of the bits of the first data and each of bits of the corresponding second data, and (ii) a second logical operation unit configured to generate a second logical value resulting from a second logic operation (e.g., a second AND operation) on the first logical values. The second logic operation unit may be configured to output the comparison signal.

The first logical operation unit may include a plurality of AND gates, and each of the plurality of AND gates may perform an AND operation on a corresponding one of the bits of the first data and a corresponding one of the bits of the second data.

The bias unit may adjust, set or maintain a voltage level of the bias signal based on a value of the comparison signal.

The output unit may include a differential amplifier, the differential amplifier may have or provide a tail current, the tail current may be adjusted or maintained by the bias unit based on the voltage level of the bias signal, and the current value may be adjusted based on the (adjusted) tail current.

The first data may be data configured to drive pixels of an i-th (i being a natural number equal to or greater than 1) row (e.g., a first row) of the display panel, and the second data may be data configured to drive pixels of a (i+1)-th row (e.g., a second or adjacent row) of the display panel.

According to another aspect of the present invention, a display device includes a display panel including gate lines, data lines and pixels connected to the gate lines and the data lines, the pixels being in a matrix including rows and columns, a data driver configured to drive the data lines, and a gate driver configured to drive the gate lines. The data driver is the data driver described herein.

According to yet another aspect of the present invention, a method of driving a display panel including gate lines, data lines and pixels connected to the gate lines and the data lines, the pixels being in a matrix including rows and columns, includes first data configured to drive pixels of an i-th (i being a natural number equal to or greater than 1) row (e.g., a first row) of the display panel, storing second data configured to drive pixels of a (i+1)-th row (e.g., a second or adjacent row) of the display panel, determining whether the stored first data is equal to the stored second data, and adjusting, setting or maintaining a current value of a drive current configured to drive pixels of the (i+1)-th row to or at a first current value or a second current value depending on whether the stored first data is equal to the stored second data.

If the stored first data is not equal to the stored second data, the current value of the drive current may be adjusted, changed or set to the first current value.

If the stored first data is equal to the stored second data, the current value of the drive current may be adjusted, changed or set to the second current value. The second current value may be less than the first current value.

The first data may have a number of bits equal to that of the second data.

Determining whether the stored first data is equal to the stored second data may include performing a logic (e.g., AND) operation on the stored first data and the stored second data.

Embodiments may reduce power consumption and prevent deterioration of a display screen.

It is to be understood that both the foregoing general description and the following detailed description of various embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
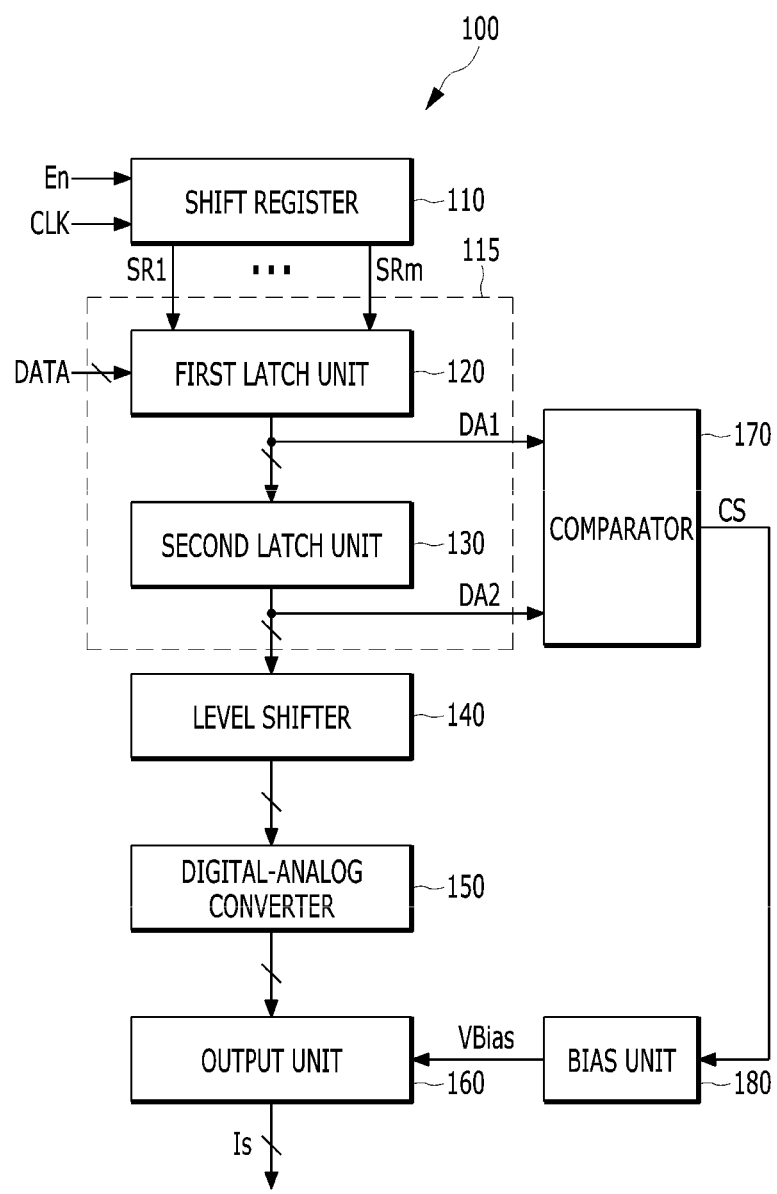
FIG. 1 is a schematic block diagram showing an exemplary data driver according to one or more embodiments of the present invention.

Hereinafter, embodiments of the present invention capable of realizing the above-described objects will be described with reference to the accompanying drawings.

In description of the embodiments, it will be understood that, when an element such as a layer (film), region, pattern or structure is referred to as being formed "on" or "under" another element, such as a substrate, layer (film), region, pad or pattern, it can be directly "on" or "under" the other element or be indirectly "on" or "under" the other element with intervening elements therebetween. It will also be understood that "on" and "under" the element is described relative to the drawings. In addition, the same reference numerals designate the same constituent elements throughout the description of the drawings.

In addition, the relative terms "first" and "second", "top"/"upper"/"above", "bottom"/"lower"/"under" and the like in the description and in the claims may be used to distinguish between any one substance or element and other substances or elements and not necessarily for describing any physical or logical relationship between the substances or elements or a particular order.

The terms "comprises", "includes", and "has" described herein should be interpreted not to exclude other elements, but to further include such other elements, since the other elements may be present, unless mentioned otherwise.

FIG. 1 is a schematic block diagram showing an exemplary data driver 100 according to one or more embodiments of the present invention.

Referring to FIG. 1, the data driver 100 includes a shift register 110, a latch unit 115, a level shifter unit 140, a digital-analog converter 150, an output unit 160, a comparator 170 and a bias unit 180.

The shift register 110 generates shift signals SR1 to SRm (m being a natural number greater than 1) in response to a control signal (e.g., an enable signal) En and a clock signal CLK to control the timing when data DATA (e.g., digital image data) is sequentially stored in a first latch unit 120.

For example, the shift register 110 may receive a horizontal start signal from a timing controller 205 (see, e.g., FIG. 5) and shift the received horizontal start signal in response to the clock signal CLK, thereby generating the shift signals SR1 to SRm (m being a natural number greater than 1). Here, the horizontal start signal may be used interchangeably with a start pulse.

Figure 5:
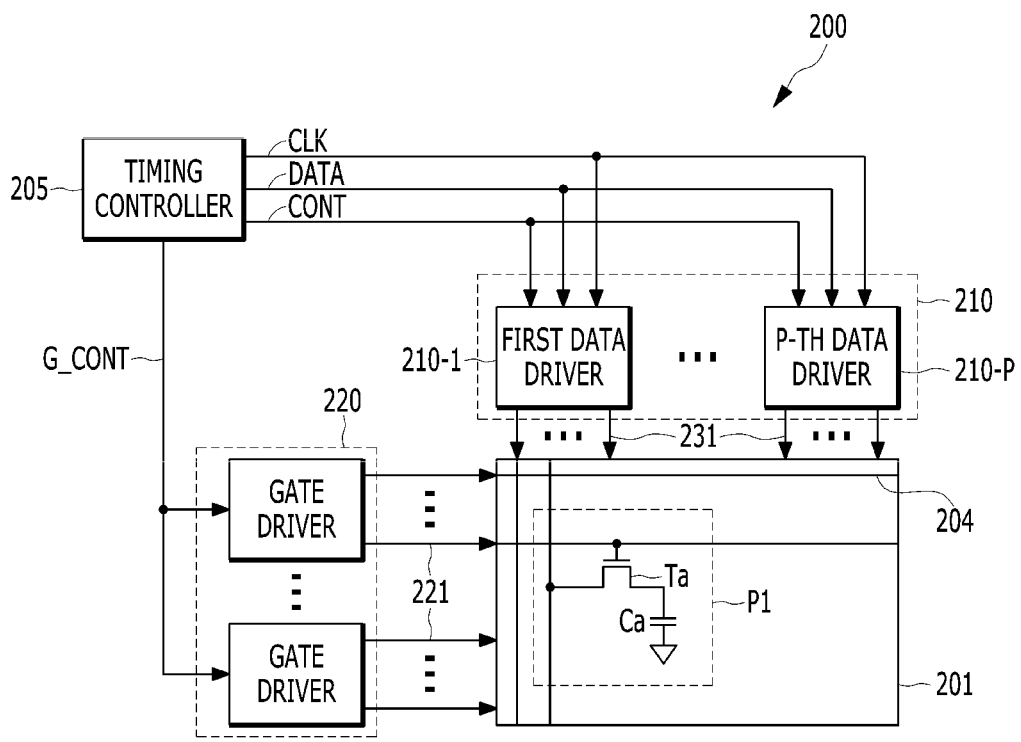
FIG. 5 is a diagram showing an exemplary display apparatus according to one or more embodiments of the present invention.

The latch unit 115 may store first data DA1 and second data DA2, which may be received sequentially or in inverse sequence from the timing controller 205 (see, e.g., FIG. 5).

For example, the latch unit 115 may include a first latch unit 120 configured to store first data DA1 and a second latch 130 configured to store second data DA2.

The first data DA1 may be data corresponding to pixels of a K-th (K being a natural number equal to or greater than 1) row of the display panel 201 (see, e.g., FIG. 5), and the second data DA2 may be data corresponding to pixels of a (K+1)-th row of the display panel 201 (see, e.g., FIG. 5).

The first latch unit 120 receives the data DATA including N (N being a positive rational number) bits from the timing controller 205 (see, e.g., FIG. 5) and stores the received data in response to the shift signals SR1 to SRm (m being a natural number greater than 1) generated by the shift register 110. The data stored in the first latch unit 120 may be referred to as "first data DA1.

For example, the first latch unit 120 may include a plurality (e.g., M, M being a natural number of at least two and less than or equal to N) of first latches (not shown), and the first latches may store M bits of the first data DA1 (M being a natural number).

For example, the data DATA received from the timing controller 205 may include red (R), green (G) and blue (B) pixel and/or color data and the plurality of first latches of the first latch unit 120 may store the R, G and/or B pixel and/or color data.

That is, the data DATA received from the timing controller 205 in response to the shift signals SR1 to SRm (m being a natural number greater than 1) may be sequentially stored in the first latches of the first latch unit 120.

The first data stored in the first latch unit 120 may be transmitted to the second latch unit 130, and the first data DA1 stored in the first latch unit 120 may be updated with new data DATA received from the timing controller 205 (see, e.g., FIG. 5).

The second latch unit 130 receives the first data DA1 from the first latch unit 120 and may store the received first data DA1 as the second data DA2 in response to a control signal (not shown), which may be provided by the timing controller

205. The second latch unit 130 may store the received first data DA1 as the second data DA2 when new data is received in the first latch unit 120. Accordingly, the second data DA2 stored in the second latch unit 130 may be updated by or replaced with first data DA1 from the first latch unit 120 (or, in some embodiments, vice versa).

For example, although the first and second data stored in the first latch unit 120 and the second latch unit 130 may have the same number of bits, embodiments of the invention are not limited thereto. In other embodiments, the number of bits of the data stored in the second latch unit 130 may be greater than the number of bits of data stored in the first latch unit 120, or vice versa.

In addition, although the number of first latches of the first latch unit 120 may be equal to the number of second latches of the second latch unit 130, embodiments of the invention are not limited thereto. In other embodiments, the number of second latches of the second latch unit 130 may be greater than the number of first latches of the first latch unit 120.

For example, the second latch unit 130 may store the data output from the first latch unit 120 in horizontal line period units.

The horizontal line period may be the number of bits and/or the length of time necessary to store the data corresponding to one horizontal line or row 204 (see, e.g., FIG. 5) of the display panel 201 (see, e.g., FIG. 5) in the second latches of the second latch unit 130.

The level shifter unit 140 shifts the voltage level of the second data DA2 received from the second latch unit 130.

For example, the driving voltage or bias voltage of the level shifter unit 140 may be greater than that of the first latch unit 120 and the second latch unit 130.

The level shifter unit 140 may include a plurality of level shifters, and the number of level shifters may be equal to the number of first latches of the first latch unit 120 and/or the number of second latches of the second latch unit 130, without being limited thereto.

The digital-analog converter (DAC) 150 converts the digital output signal(s) of the level shifter 140 (e.g., the multi-bit first or second data, the level of which is shifted) into an analog signal.

For example, grayscale voltages or reference voltages from a power supply (not shown) may be received by the DAC to convert the digital output signal(s) of the level shifter unit 140 into the analog signal.

The output unit 160 amplifies and/or buffers the analog signal output from the digital-analog converter 150 and outputs the amplified and/or buffered analog signal. For example, the amplified and/or buffered analog signal may be a drive current Is configured to drive the pixels (e.g., P1) of the display panel 201 (see, e.g., FIG. 5). For example, the output unit 160 may include a plurality of amplifiers and/or a plurality of buffers.

For example, each of the plurality of amplifiers of the output unit 160 may include a differential amplifier and/or a rail-to-rail amplifier.

The output unit 160 may output the drive current Is that drives the panel based on the analog signal output from the digital-analog converter 150 and the bias signal.

The comparator 170 receives the first data DA1 and the second data DA2 from the latch unit 115 and outputs a comparison signal CS as a result of comparing the received first data DA1 with the second data DA2.

For example, the comparator 170 may receive the first data DA1 stored in the first latch unit 120 and the second data DA2 stored in the second latch unit 130 and output the comparison signal CS.

The bias unit 180 provides the bias signal VBias to the output unit 160. For example, the bias signal VBias may be a bias voltage.

The bias unit 180 receives the comparison signal CS from the comparator 170 and adjusts the current value of the drive current Is that drives the pixels (e.g., P1) of the display panel 201 (see FIG. 5) based on the received comparison signal CS.

For example, the bias unit 180 may adjust or maintain the level of the bias signal VBias received from the output unit 160 based on the comparison signal CS. When the level of the bias signal VBias is adjusted by the bias unit 180, the current value of the drive current Is output from the output unit 160 may be adjusted (e.g., correspondingly and/or proportionately).

For example, as the voltage level of the bias signal VBias is adjusted, the tail current of the differential amplifier of the output unit 160 may be adjusted, and the current value of the drive current Is may be adjusted.

The comparator 170 may output the comparison signal CS having a first logical value or a first digital value (e.g., 1) when the first data DA1 and the second data DA2 are equal.

In contrast, the comparator 170 may output a second logical value or a second digital value (e.g., 0) when the first data DA1 and the second data DA2 are not equal. The first logical value (or the first digital value) and the second logical value (or the second digital value) are different from each other.

For example, the bias unit 180 may adjust the level of the bias signal VBias (e.g., the bias voltage) based on the result of the logic (e.g., AND) operation on the first data DA1 and the second data DA2. In addition, there may be a delay circuit (e.g., a flip-flop or latch) in the path between the comparator 170 and the output unit 160 configured to ensure that the bias signal VBias is applied to the output unit 160 when the data stored in the first latch unit 120 is received by the output unit 160.

Figure 2:
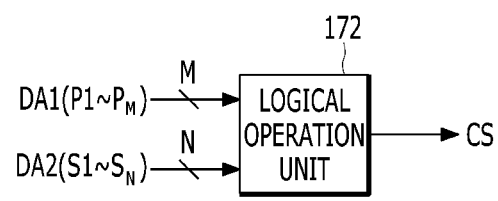
FIG. 2 is a diagram showing an exemplary embodiment of a comparator suitable for use in the data driver of FIG. 1.

FIG. 2 is a diagram showing an exemplary embodiment of the comparator 170 suitable for use in the data driver of FIG. 1.

Referring to FIG. 2, the comparator 170 may include a logical operation unit 172 configured to receive the first data DA1 (P1 to PM) from the first latch unit 120 and the second data DA2 (S1 to SN) from the second latch unit 130, and output the comparison signal CS based on a logic operation (e.g., an AND operation) on the first data DA1 (P1 to PM) and the second data DA2 (S1 to S1). N may be equal to M, without being limited thereto. The logic operation may also be equivalent to an AND operation (e.g., a NAND operation, a NAND operation and an inversion operation, etc.).

Figure 3:
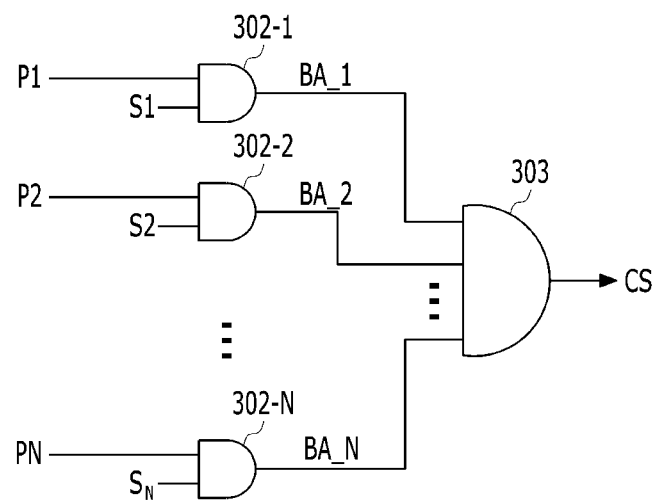
FIG. 3 is a diagram showing an embodiment of a logical operation unit as shown in FIG. 2.

FIG. 3 is a diagram showing an exemplary embodiment of the logical operation unit 172 shown in FIG. 2.

Referring to FIG. 3, the logical operation unit 172 may include a plurality of first AND gates 302-1 to 302-N and a second AND gate 303. For example, in FIG. 3, the number of bits of the first data DA1 and the second data DA2 may be equal to each other.

Each of the plurality of first AND gates 302-1 to 302-N may perform an AND operation on first and second data bits (e.g., P1 and S1) that correspond to each other from the first data DA1 (P1 to PM) and the second data DA2, and output first logical values BA_1 to BA_N based on the results of the AND operations.

The second AND gate 303 may perform an AND operation on the first logical values BA_1 to BA_N, and output a second logical value based on the result of the AND operation as the comparison signal CS.

FIG. 5 is a diagram showing an exemplary display apparatus 200 according to one or more embodiments of the present invention.

Referring to FIG. 5, the display apparatus 200 includes a display panel 201, a timing controller 205, a data driver unit 210 and a gate driver unit 220.

The display panel 201 may include gate lines 221 that form rows and data lines 231 that form columns, both of which cross each other to form a matrix. The display panel 201 may include pixels (e.g., P1) connected to the crossing gate and data lines 221 and 231.

The pixels may be connected to the gate lines 221 and the data lines 231 and may be in a matrix having rows and columns.

Each pixel may include a transistor Ta connected to a gate line and a data line and a capacitor Ca connected to the transistor Ta.

For example, the pixels may include a first subgroup of red (R) pixels, a second subgroup of green (G) pixels and a third subgroup of blue (B) pixels, and each of the R, G and B pixels may include a transistor Ta connected to a gate line and a data line, and a capacitor Ca connected to the transistor Ta.

The timing controller 205 outputs a clock signal CLK, data DATA, a first control signal CONT configured to control the data driver unit 210, and a second control signal G_CONT configured to control the gate driver 220.

For example, the first control signal CONT may include a horizontal start signal input to the shift register 110 (see, e.g., FIG. 1) of the data driver and/or an enable signal En (see, e.g., FIG. 1). The second control signal G_CONT may include a gate drive signal configured to drive the gate lines.

The gate driver unit 220 may drive the gate lines 221, include a plurality of gate drivers, and output gate drive signals configured to control the transistors Ta of the pixels connected to the gate lines 221.

The data driver unit 210 may drive the data lines 231 and include a plurality of data drivers 210-1 to 210-P (P being a natural number greater than 1).

Each of the data drivers 210-1 to 210-P (P being a natural number greater than 1) may correspond to the embodiment 100, as shown in FIG. 1.

Figure 4A:
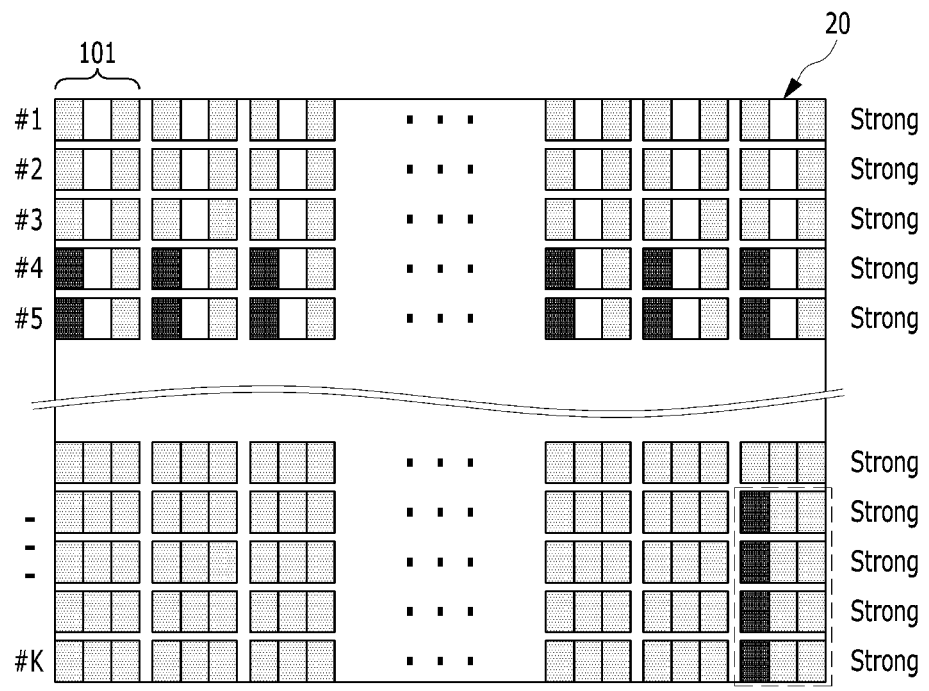
FIG. 4A is a diagram showing a concept of a conventional data driver configured to drive a display panel.

FIG. 4A is a diagram showing a concept of a conventional data driver configured to drive the display panel 20.

FIG. 4A shows a pattern in which a plurality of rows #1 to #K (K being a natural number greater than or equal to 1) of the display panel 20 are displayed in terms of rows.

In the example of FIG. 4A, the first to third rows #1 to #3 of the display panel 20 are displayed in the same pattern (or the same brightness or color). In contrast, the fourth and fifth rows of the display panel 20 may be displayed in a pattern different from that of the first to third rows, but in which the fifth row is displayed as the same pattern as the fourth row.

In FIG. 4A, the current value of the drive current of the data driver has a high value (strong) regardless of the display pattern of the first to K-th rows (#1 to #K).

In general, the capacitors of the pixels are charged with a drive current from the data driver having a current value that does not cause deterioration of the screen, but that wastes power.

Figure 4B:
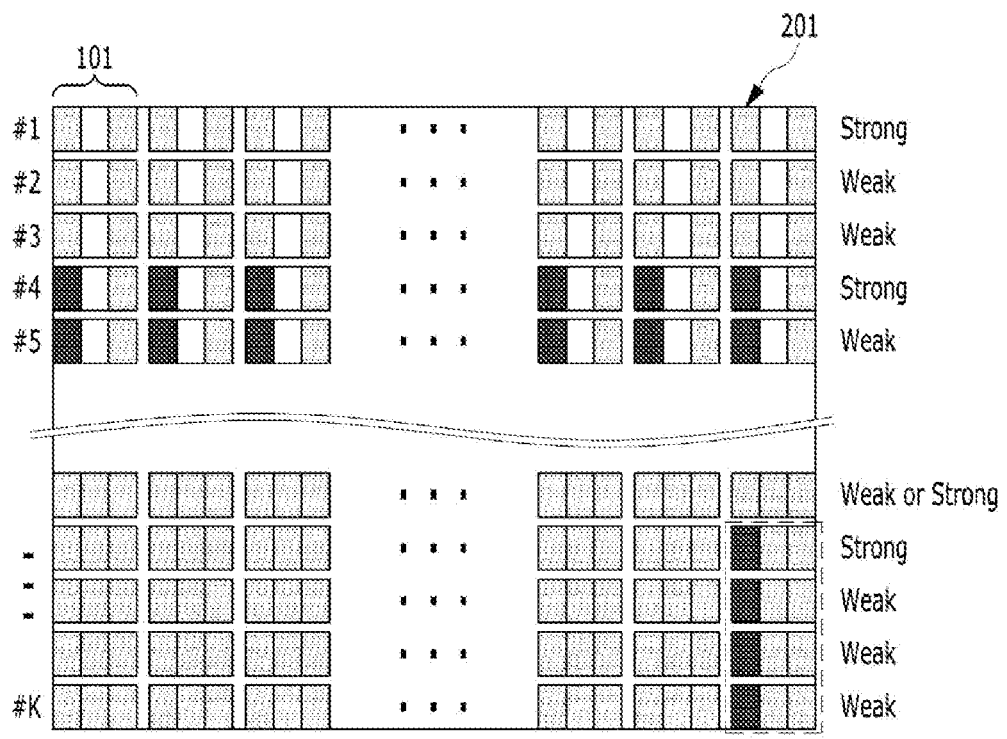
FIG. 4B is a diagram showing a concept of an exemplary data driver configured to drive a display panel according to one or more embodiments of the present invention.

FIG. 4B is a diagram showing a concept of an exemplary data driver 100 configured to drive the display panel 201 according to one or more embodiments of the present invention.

Referring to FIG. 4B, the data driver 100 may drive the first row of the display panel with the drive current having a high first current value (strong).

Since the second row #2 of the display panel 201 has the same display pattern as the first row #1, the data driver 100 may drive the second row with the drive current having a second, relatively low current value (weak).

The second current value is less than the first current value, and thus the first current value may be labeled as "strong and the second current value may be labeled as "weak.

In addition, since the third row #3 has the same display pattern as the second row #2, the data driver 100 may drive the third row #3 with the drive current having the second, relatively low current value (weak).

Since the fourth row #4 of the display panel 201 has a display pattern different from that of the third row #3, the data driver 100 may drive the fourth row #4 with the drive current having the first, relatively high current value (strong).

In addition, since the fifth row #5 of the display panel 201 has the same display pattern as the fourth row #4, the data driver 100 may drive the fifth row #5 with the drive current having the second, relatively low current value (weak).

The data driver 100 may drive the other rows #6 to #K of the display panel 201, using the above-described method.

For example, in the first row #1 of the display panel 201, the capacitors of the pixels may be charged with the driving signal having the first, relatively high current value (strong) by default.

In addition, if the display pattern of the (i+1)-th (i being a natural number of at least 1, but less than K) row is equal to that of the i-th row, the pixel of the (i+1)-th row may be charged with a drive current having the second, relatively low current value (weak).

If the display pattern of the (i+1)-th (i being a natural number of at least 1, but less than K) row is different from that of the i-th row, the pixel of the (i+1)-th row may be charged with drive current having the first, relatively high current value (strong).

If the display pattern of the (i+1)-th row is not different from that of the i-th row, the current value of the drive current for the (i+1)-th row is set to the second current value (weak), thereby reducing power consumption.

If the display pattern of the (i+1)-th row is not different from that of the i-th row, since the voltage of the data line of the (i+1)-th is equal to that of the data line of the i-th row, the data driver 100 does not consume much current. Therefore, although current supplied from the data driver 100 to the display panel is reduced, deterioration of the screen does not occur.

If the display pattern of the (i+1)-th row is different from that of the i-th row, the current value of the drive current for the (i+1)-th row is set to the first, relatively high current value (Strong), thereby smoothly charging the pixels of the (i+1)-th row.

For example, although all rows are driven with the high current strong in FIG. 4A, some of the rows in the display 201 in FIG. 4B may be driven with a relatively high current (strong) and the other rows may be driven with a relatively low current (weak), thereby reducing power consumption.

The comparator 170 of the data driver 100 may compare the first data DA1 stored in the first latch unit 120 with the second data DA2 stored in the second latch unit 130, thereby determining whether the first data DA1 is equal to the second data DA2, thereby determining whether the display pattern of the i-th row of the display panel is the same as or different from that of the (i+1)-th row.

For example, whether the display pattern of the i-th row of the display panel 201 is different from that of the (i+1)-th row may be determined by the comparison signal CS of the comparator 170.

The current value of the drive current provided from the output unit 160 to the data lines of the display panel 201 may be adjusted to the first or relatively high current value (strong) or the second or relatively low current value (weak) by the bias unit 180 of the data driver 100.

Figure 6:
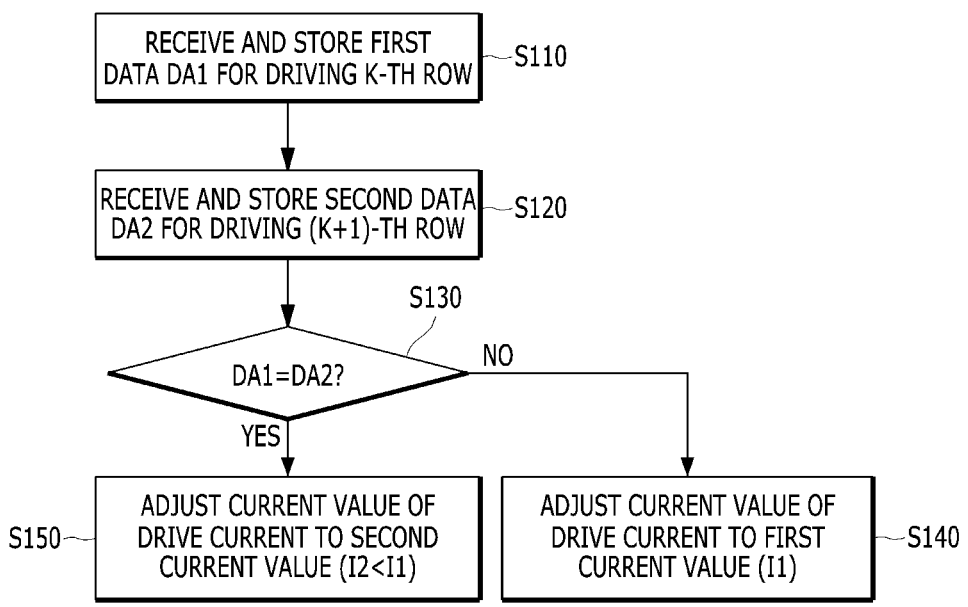
FIG. 6 is a flowchart illustrating an exemplary method of driving a display panel according to one or more embodiments of the present invention.

FIG. 6 is a flowchart illustrating an exemplary method of driving a display panel according to one or more embodiments of the present invention.

Referring to FIG. 6, the first data DA1 configured to drive the pixels of the K-th row of the display panel 201 is received and stored (S110).

Next, the second data DA2 configured to drive the pixels of the (K+1)-th pixels of the display panel 201 is received and stored (S120).

Next, whether the first data DA1 is equal to the second data DA2 is determined (S130).

For example, whether the first data DA1 is equal to the second data DA2 may be determined based on a comparison (e.g., performing a logic operation, such as an AND operation) on the first data DA1 and the second data DA2.

Next, if the first data DA1 is not equal to the second data DA2, the current value of the drive current Is configured to drive the pixels of the (i+1)-th row is adjusted to, or set or maintained at, the first, relatively high current value (e.g., I1 or Strong; S140).

Alternatively, if the first data DA1 is equal to the second data DA2, the current value of the drive current Is configured to drive the pixels of the (i+1)-th row is adjusted to the second, relatively low current value (e.g., I2 or Weak; S150).

Figure 7:
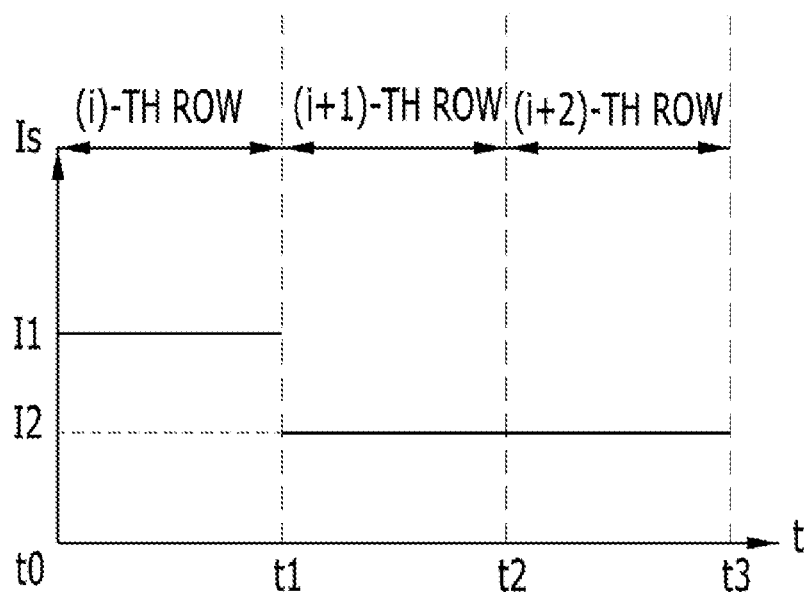
FIG. 7 is a diagram showing exemplary current values of a drive current in (i)-th, (i+1)-th and (i+2)-th rows of a display panel, according to one or more embodiments of the present invention.

FIG. 7 is a diagram showing exemplary current values of drive currents in the (i)-th, i+1-th and (i+2)-th rows of a display panel 201.

Referring to FIG. 7, the drive current Is of the data driver 100 may have the first, relatively high current value (e.g., I1 or Strong) in a drive period from t0 to t1 of the (i)-th row.

If the second data DA2 for the (i+1)-th row is equal to the first data DA1 for the (i)-th row, the drive current Is of the data driver 100 may have the second, relatively low current value (e.g., I2 or Weak) in a drive period from t1 to t2 of the (i+1)-th row.

If the second data DA2 for the (i+2)-th row is equal to the first data DA1 for the (i+1)-th row, the drive current Is of the data driver 100 may have the second, relatively low current value (e.g., I2 or Weak) in a drive period from t2 to t3 of the (i+2)-th row.

As described above, the data driver 100 according to the embodiments may reduce power consumption while preventing deterioration of the screen.

Features, structures, effects, and the like as described above in various embodiments are included in at least one embodiment of the present invention and should not be limited to only one embodiment. In addition, the features, structures, effects, and the like described in the respective embodiments may be combined or modified even with respect to the other embodiments by those skilled in the art. Accordingly, contents related to these combinations and modifications should be construed as within the scope of the present invention.

What is claimed is:
1. A data driver comprising:
 a first latch unit for storing a second data;
 a second latch unit coupled to the first latch unit and for storing a first data, wherein the first data is previous to the second data;
 a comparator configured to receive the first data from the second latch unit and the second data from the first latch unit and to output a comparison signal by comparing the received first data with the received second data;
 a level shifter unit coupled to the second latch unit and shifting a level of the first data:
 a digital-analog converter coupled to the level shifter and for converting an output of the level shifter unit into an analog signal;
 an output unit for amplifying or buffering the analog signal of the digital-analog converter and generating a drive current having a current value, the drive current configured to drive a display panel based on a bias signal and the analog signal; and
 a bias unit receiving the comparison signal from the comparator and generating the bias signal based on the comparison signal,
 wherein the comparator compares one of bits of the first data and the corresponding one of bits of the second data, the comparator outputs the comparison signal having a first logical value when the first data and the second data are equal, the comparator outputs the comparison signal having a second logical value which is different from the first logical value when the first data is not equal to the second data, the output unit comprises a differential amplifier, a tail current of the differential amplifier is adjusted or maintained based on the bias signal and the current value of the drive current is adjusted or maintained based on the tail current, the current value of the drive current has a first current value when the comparison signal has the second logical value, the current value of the drive current has a second current value when the comparison signal has the first logical value, and the second current value is smaller than the first current value bias signal.

2. The data driver according to claim 1, wherein the comparator generates the comparison signal by performing a logic operation on the first data and the second data.

3. The data driver according to claim 1, wherein the first data includes a number of bits that is equal to a number of bits of the second data.

4. The data driver according to claim 3, wherein the comparator includes:
 a first logical operation unit configured to output first logical values from a first logic operation on each of the bits of the first data and each of the corresponding bits of the second data; and
 a second logical operation unit configured to generate a second logical value from a second logic operation on the first logical values and to output the comparison signal.

5. The data driver according to claim 4,
 wherein the first logical operation unit includes a plurality of AND gates, and
 each of the plurality of AND gates performs an AND operation on one of the bits of the first data and the corresponding one of the bits of the second data.

6. The data driver according to claim 1, wherein the bias unit adjusts, sets or maintains a voltage level of the bias signal based on the first logical value or the second logical value of the comparison signal.

7. The data driver according to claim 1, wherein the first data is data configured to drive pixels of an i-th (i being a natural number equal to or greater than 1) row of the display panel, and the second data is data configured to drive pixels of an adjacent (i+1)-th row of the display panel.

8. The data driver according to claim 7, wherein the driving signal having the first current value is provided to the pixels in a first row of the display panel by default.

9. A display device comprising:
the data driver of claim 1;
a display panel including gate lines, data lines and pixels connected to the gate lines and the data lines, the pixels being in a matrix including rows and columns;
a data driver configured to drive the data lines; and
a gate driver configured to drive the gate lines.

10. A method of driving a display panel including gate lines, data lines and pixels connected to the gate lines and the data lines, the pixels being in a matrix including rows and columns, the method comprising:
first data configured to drive pixels of an i-th (i being a natural number equal to or greater than 1) row of the display panel;
storing second data configured to drive pixels of an (i+1)-th row of the display panel;
generating a comparison signal;
level shifting a level of the first data;
converting an output of the level shifted first data into an analog signal;
amplifying or buffering the analog signal and generating a drive current having a current value using a differential amplifier to drive pixels of the (i+1)-th row of the display panel based on a bias signal and the analog signal; and
generating the bias signal based on the comparison signal, wherein:
generating the comparison signal comprises:
comparing one of bits of the first data and the corresponding one of bits of the second data;
outputting the comparison signal having a first logical value when the first data and the second data are equal; and
outputting the comparison signal having a second logical value which is different from the first logical value when the first data is not equal to the second data,
a tail current of the differential amplifier is adjusted or maintained based on the bias signal, and the current value of the drive current is adjusted or maintained based on the tail current,
when amplifying or buffering the analog signal and generating a drive current, the current value of the drive current has a first current value when the comparison signal has the second logical value,
the current value of the drive current has a second current value when the comparison signal has the first logical value, and
the second current value is smaller than the first current value.

11. The method according to claim 10, wherein the first data has a number of bits that is equal to that of the second data.

12. The method according to claim 10, wherein generating the comparison signal comprises performing a logic operation on the first data and the second data.

13. The method according to claim 10, further comprising providing the driving signal having the first current value to the pixels in a first row of the display panel by default.

* * * * *